United States Patent
Srebranig

(10) Patent No.: US 7,496,162 B2
(45) Date of Patent: Feb. 24, 2009

(54) COMMUNICATION SYSTEM WITH STATISTICAL CONTROL OF GAIN

(75) Inventor: Steven F. Srebranig, Johnsburg, IL (US)

(73) Assignee: STMicroelectronics, Inc., Carrollton, TX (US)

( * ) Notice: Subject to any disclaimer, the term of this patent is extended or adjusted under 35 U.S.C. 154(b) by 790 days.

(21) Appl. No.: 10/999,702

(22) Filed: Nov. 30, 2004

(65) Prior Publication Data
US 2006/0115027 A1  Jun. 1, 2006

(51) Int. Cl.
H04L 27/08 (2006.01)

(52) U.S. Cl. .............. 375/345; 455/127.1; 455/136; 455/138; 455/232.1; 455/245.1

(58) Field of Classification Search ........ 455/127.1, 455/232.1, 136, 138, 219, 355, 245.1; 375/345
See application file for complete search history.

(56) References Cited

U.S. PATENT DOCUMENTS

| | | | |
|---|---|---|---|
| 5,267,272 A | 11/1993 | Cai et al. | |
| 5,696,798 A | 12/1997 | Wright et al. | |
| 5,917,865 A | 6/1999 | Kopmeiners et al. | |
| 6,154,503 A * | 11/2000 | Strolle | 375/264 |
| 6,314,278 B1 | 11/2001 | Hassan | |
| 6,591,092 B1 * | 7/2003 | Tsuruoka | 455/232.1 |
| 2003/0142659 A1 | 7/2003 | Chia-Liang et al. | |

FOREIGN PATENT DOCUMENTS

| | | | |
|---|---|---|---|
| EP | 0999649 A | 5/2000 | |
| EP | 1089429 A | 4/2001 | |
| EP | 1473831 A | 11/2004 | |
| GB | 2371690 A | 7/2002 | |
| WO | WO 02/27924 A | 4/2002 | |
| WO | WO 2004/075469 A | 9/2004 | |

OTHER PUBLICATIONS

Texas Instrument, Technical Brief SWRA030, Matt Roy, May 1999.*

* cited by examiner

*Primary Examiner*—Ted Wang
(74) *Attorney, Agent, or Firm*—Lisa K. Jorgenson; Renee Michelle Leveque

(57) ABSTRACT

In a communication receiver having a variable gain amplifier and an automatic gain controller, the automatic gain controller is operable to measure values of a system performance parameter indicative of the performance of the communication system, determine a statistical value of the system performance parameter, and adjust the variable gain of the amplifier in response to the statistical value to maintain the statistical value in a control range.

32 Claims, 6 Drawing Sheets

COMMUNICATION SYSTEM WITH STATISTICAL CONTROL OF GAIN

FIELD

This invention relates generally to the field of communication systems. More particularly, this invention relates to automatic gain control in a communication system.

BACKGROUND

Many communication systems use automatic gain control to adjust various amplifier gains in the system. If the gain is too low, the system may be too sensitive to noise, while if the gain is too high the power consumption may be too great. Automatic gain controls seek to adjust the gains to balance these competing requirements. Automatic gain controls are a direct feedback mechanism, a mechanism that determines the difference between an output signal and its input signal (or a reference signal level) within a few operational blocks of a system. The automatic gain control applies a simple, linear function of this difference to the input, attempting to maintain the output at a predetermined ideal value. For ill-behaved or inconsistent inputs, or inputs that become non-linear (due to noise spikes, etc.), the feedback mechanism is often too rigid in its simplicity, and too direct in its parametric identity, to keep the system from transient instability.

In the receiver of a control system, the signals are subject to noise interference. A particular disadvantage of the direct feedback method is that is seeks to control gain even if it is responding only to the noise in the input. This is the case even when the envelope or power of the signal is monitored rather that the signal itself. A further disadvantage is that there may be no simple relationship between the level of the gain and the overall performance of communication receiver, which means that it is very difficult to know how to adjust the gain for optimal performance.

SUMMARY

The present invention relates generally to automatic gain control in a communication system. Objects and features of the invention will become apparent to those of ordinary skill in the art upon consideration of the following detailed description of the invention.

In one embodiment of the invention a communication receiver includes an amplifier having a variable gain and an automatic gain controller. The amplifier is operable to amplify a signal in the communication receiver, and the automatic gain controller is operable to monitor the performance of the communication receiver, calculate a statistical value indicative of the performance of the communication system, and adjust the variable gain of the amplifier in response to the statistical value to maintain the statistical value in a control range.

BRIEF DESCRIPTION OF THE DRAWINGS

The novel features believed characteristic of the invention are set forth in the appended claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
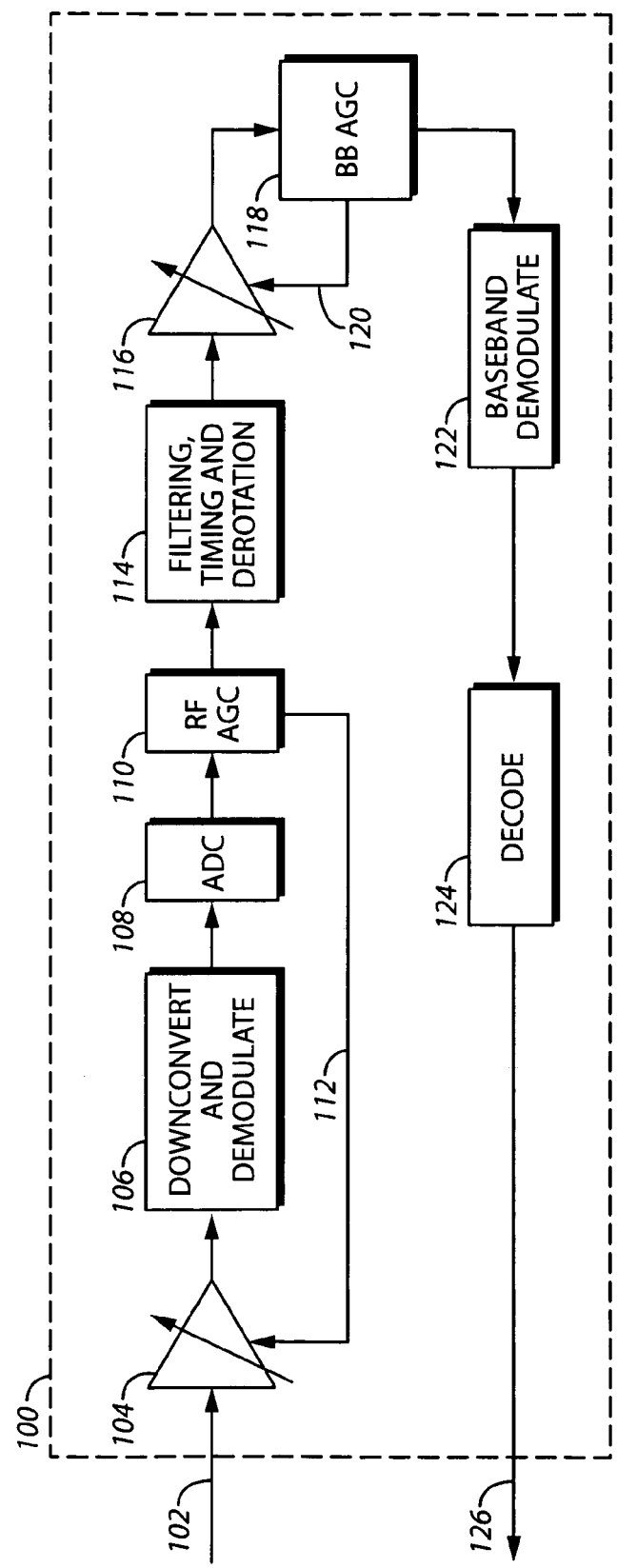
FIG. 1 is a block diagram of an automatic control structure of a communication receiver of the prior art.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

FIG. 1 shows a block diagram of an automatic control structure of both the RF (radio frequency) input and BB (Base Band) demodulation sections of a prior communication receiver 100. In FIG. 1, a received communication signal 102 is amplified in a variable gain amplifier 104 before being down-converted and demodulated at 106. The resulting analog signal is sampled by an ADC (analog-to-digital converter) 108. The sampled (digital) signal is used in an RF automatic gain control (AGC) circuit 110 to provide a control signal 112 that is used to adjust the gain of the variable gain amplifier 104. The sampled signal is then processed further at 114. For example, in-phase and quadrature components of the signal may be obtained by filtering, timing adjustment and de-rotation. The signal is then amplified in a base-band amplifier 116. The output from the base-band amplifier 116 is used in an AGC circuit 118 to produce a control signal 120 that is used to adjust the gain of the variable gain amplifier 116. The amplified signal is then demodulated to base-band in a demodulator 122 before being decoded in a decoder 124 to provide the transmitted data stream 126. It can be seen that no measurement of accuracy of the decoded data symbol 126 is used to adjust the gains of the variable gain amplifiers 104 and 116. Further, the first AGC circuit operates independently of the second AGC.

Figure 2:
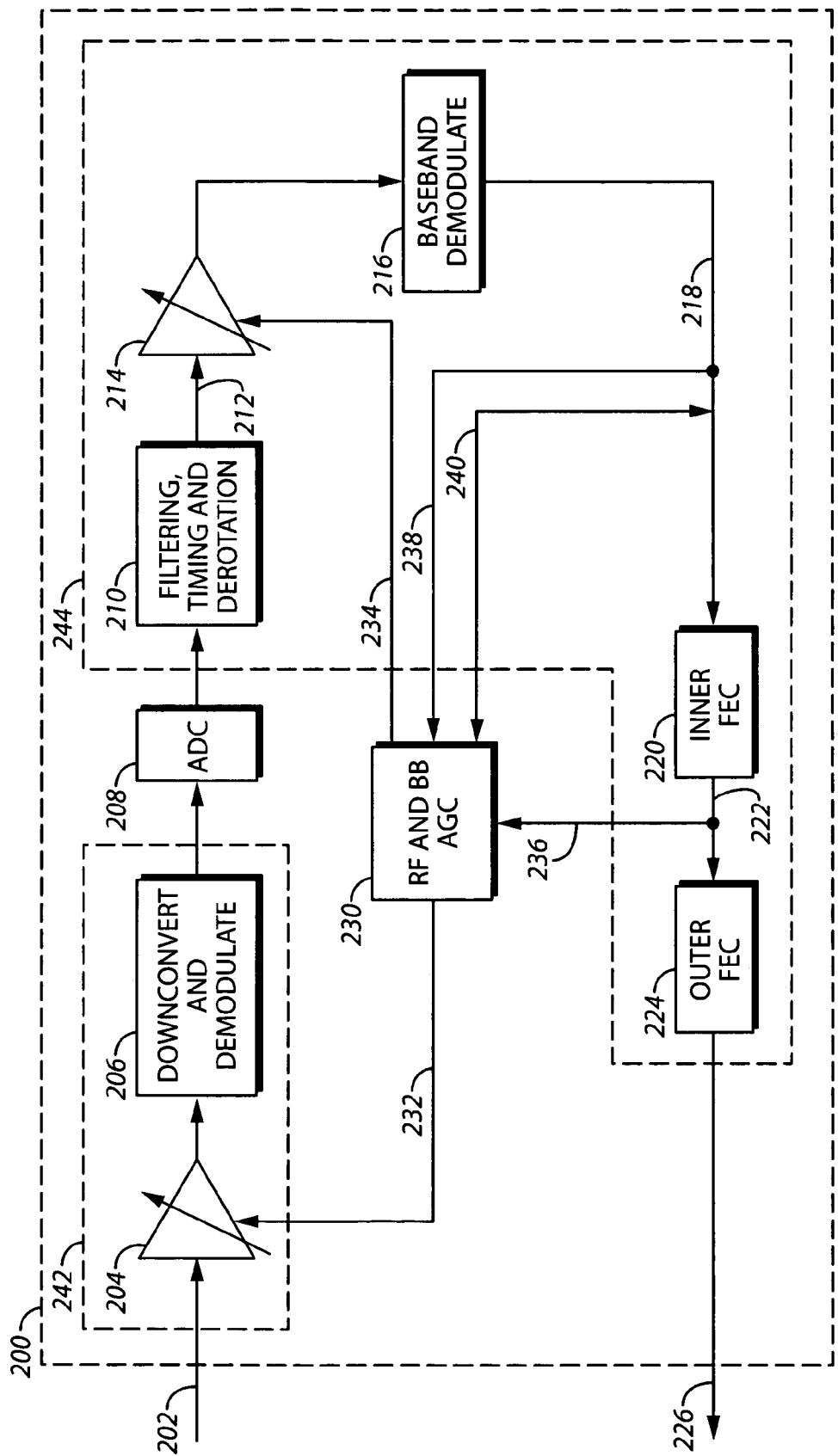
FIG. 2 is a block diagram of an automatic control structure of a communication receiver consistent with an embodiment of the present invention.

FIG. 2 shows a block diagram of an automatic control structure of both the RF (radio frequency) input and BB (Base Band) demodulation sections of an exemplary integrated receiver decoder (IRD) 200 consistent with an embodiment of the present invention. Referring to FIG. 2, a received communication signal 202 is amplified in a variable gain amplifier 204 before being down-converted and demodulated at 206. The resulting analog signal is sampled by ADC (analog-to-digital converter) 208. The sampled signal is then processed further at 210 to produce signal 212. For example, in-phase and quadrature components of the signal may be obtained by filtering, timing adjustment and de-rotation. The signal 212 is then amplified in a base-band amplifier 214. The amplified signal is then demodulated to base-band in a demodulator 216 to produce a base-band (BB) signal 218 to be decoded. The base-band signal 218 includes both information bits and redundancy bits. There is a significant probability that the information bits have been disturbed and made unreliable due to the noisy nature of the transmission. The redundancy bits are used in a decoder to correct errors in the information bits due to noise added after encoding. Comparison of the redundancy bits and information bits to ideal bit states can be used to calculate a 'base-band, (BB)' carrier-to-noise ratio (C/N or CNR) that is significantly correlated to the bit-error-rate (BER) of the system input 202. In the embodiment shown in FIG. 2, the decoder takes the form of an inner (Viterbi, Turbo Code, or LDPC, for example) forward error corrector (FEC) 220 that operates on the base-band signal 218 to predict the most likely state of each bit (0 or 1). The output 222 from the inner FEC provides a second error value as a bit-error-rate (BER). The signal 222 then passes through an outer (Reed-Solomon or Bose-Chaudhuri-Hocquenghem (BCH) for example) FEC 224, which may correct several bytes within a package, and optionally provides a third error value as a bit-error-rate (BER). The decoded bit stream is output at 226.

Automatic gain control (AGC) of the digital receiver shown in FIG. 2 occurs in a couple of blocks within the front end (tuner and demodulator) circuit, namely for the RF input 202 and for the input 212 of base-band signal demodulator 216. To facilitate overall system control, the automatic gain controls are integrated. In this embodiment the controls are cascaded as an RF control primary (providing coarse adjustment) and base-band control secondary (providing fine adjustment).

An AGC controller 230 provides control signals 232 and 234 that control the gains of variable gain amplifiers 204 and 214, respectively. Adjustments to both the RF signal input 202 and base-band input 212 directly and predominately affect the bit-error-rate (BER) performance of the system. Bit error rate (BER) is an important system performance parameter for measuring the performance of the digital front end. There are no dynamic changes in the bit-error-rate (BER) due to decoding of the outer FEC 224 and inner FEC 220 blocks, since they use predetermined and fixed settings and algorithms. However, the bit-error-rate (BER) can be used to estimate the CNR. Dynamic changes to the system, reflected in a bit-error-rate measurement, is due to the input RF signal 202 level and quality as well as the digital signal level and quality into the demodulator 216. Thus, the AGC controller 230 is responsive to the error signal 238 that is directly related to signal level and quality, and determines the dynamic BER performance of the decoder. The bit-error-rate may be calculated from the base-band signals 222 and 218, respectively. In an alternative embodiment, AGC controller 230 is responsive to the base-band signal 218, and determines the CNR from the base-band signal. In order to set various parameters within AGC control algorithm, an initial training or calibration may be performed, in which data 240 is passed between the decoder and the AGC controller 230. For example, the noise levels (CNR or BER) may be measured for a number of different gains to build a look-up table relating the noise level to the gains.

The variable gain amplifier 204 and the down-converter and demodulator 206 are part of the analog stage (or front end) 242 of the receiver 200. The filtering, timing and de-rotation element 210, the variable gain amplifier 214, the base-band demodulator 216, and the inner and outer FEC, 220 and 224 respectively, of the decoder form part of the digital stage 244 of the receiver 200. Thus, in the embodiment shown in FIG. 2, there is a variable gain amplifier in both the analog and digital stages of the receiver. Detailed operation of the AGC controller will be discussed below.

BER performance is highly correlated to the carrier to noise ratio (CNR), so CNR may be used by the AGC controller as an equivalent to BER. The CNR of the digital stage may be stored in special noise registers in the decoder, which can be set to identify the signal quality before any forward error correction (FEC), just after the base band manipulations are completed, right after the inner FEC, or after the final, outer FEC.

It is noted that equivalent post inner FEC measurements of CNR can be deduced from the measurements before the inner FEC. Both of these measurements provide much quicker estimation of the final BER of the system, since post RS measurements are typically quasi-error free and can take days to show errors while the measurements before the inner FEC gives ample evidence of overall system performance within seconds.

The system performance is a highly non-linear function of the amplifier gains, so conventional, linear feedback control methods cannot be used. Instead, the AGC controller uses non-linear feedback control that incorporates stochastic methods. One embodiment of the AGC controller employs Statistical Process Control (SPC), such as Shewhart's process management control charts, to provide an indirect parametric control of the input signal. That is, instead of using an analog of the input signal for control, a system performance parameter is used as an indirect measure of the state, quality, and level of the input that drives the entire system. The system performance parameter is a key parameter of the overall state of the system. This method provides a signal control that is inherently damped, maintaining quick and adaptive maintenance of the input.

The general method views the AGC controller of a system as the "engine" of an overall and potentially complex conglomeration of related, but diverse operational blocks. Traditionally, this aforementioned system engine is treated in isolation, irrespective of the totality of the system, and there is no global method of controlling the input.

Together, all the blocks of an operational structure of the receiver create something akin to a manufacturing system, with expected Gaussian variations. Electrical systems include variations of the input itself which will invariably contain some additive white Gaussian noise (AWGN). The objective of the AGC controller is similar to that of a normal manufacturing system: control the quality of the output parameter by maintaining the quality of the input—without attempting to adjust what cannot be adjusted. Normal variations within the system blocks cannot be controlled and attempting to control them can be counter productive. Significant normal variations can be recognized, however, when such blocks might need replacement or repair or re-design (such as in a sub-optimized FEC).

The noise in the system (AWGN or other noise) cannot be controlled. Moreover, its level can change, dramatically affecting the CNR of the input. When the noise level is significant, "pumping up" the signal by increasing the gains will only bring saturation. Prior to saturation, the traditional gain control will function correctly but ineffectively, leaving the rest of the system without a useful input and unknowing of the reason (because the gain control is within an isolated block).

Statistical Process Control (SPC) has been used to manage the even running of a manufacturing process within the normal variation of the constituent parts of the system. The idea of SPC is three-fold: 1) to keep within the Gaussian bounds or normal statistical variations of the system, 2) define the control limits of the system variables or parameters so that they obey these aforementioned bounds, 3) accommodate the external needs of the system while obeying the first two ideas (that is, the external world will need a certain level of effectiveness from the system; obey these needs as well as possible).

Statistical Process Control (SPC) uses a system performance parameter that 1) facilitates the true understanding of proper system performance, and 2) correlates directly to changes in the input signal. In one embodiment of the present invention, the carrier-to-noise ratio (CNR) will be the system performance parameter used for statistical process control in the AGC controller. SPC of the CNR indicates how and when to adjust the signal levels.

Thus, in one embodiment of the invention, automatic control of a variable gain in a communication system is achieved by measuring a plurality of values of a system performance parameter indicative of the performance of the communication system, determining a statistical value (such as the mean and/or range) of the plurality of values of the system performance parameter and then adjusting the variable gain if the statistical value is outside of a control limit.

In one embodiment of the invention, the AGC controller employs Statistical Process Control using Shewhart control charts for the mean $\overline{X}$ and range R of the system performance parameter.

Figure 3:
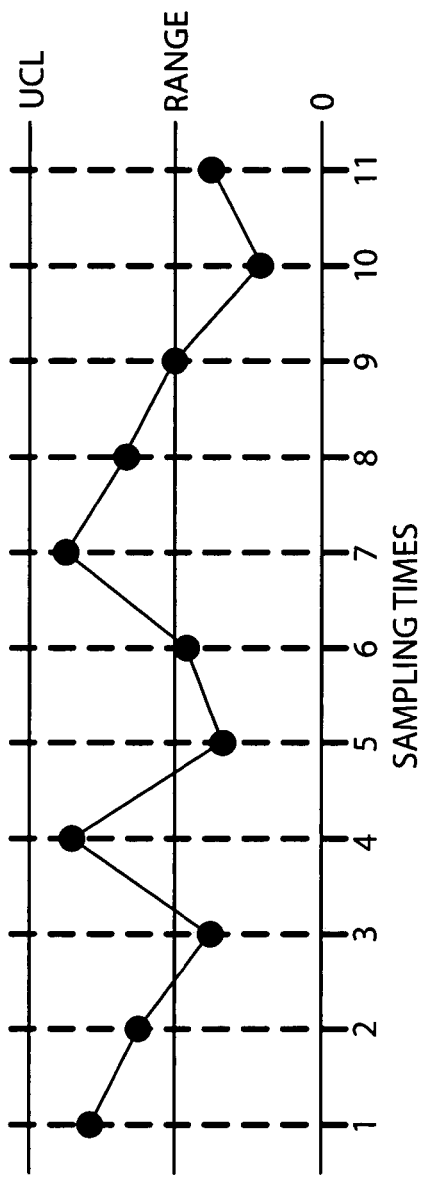
FIG. 3 is an exemplary Shewhart Range Chart, consistent with an embodiment of the present invention.

An exemplary Shewhart Range Chart is shown in FIG. 3. At each sampling time, a set of datum points (such as CNR measurements) are collected and the range (or spread) is calculated. The range chart shows the range at a number of sampling times. The upper horizontal line shows the Upper Control Limit (UCL), which may be set to three times the standard deviation, i.e. "3σ". The lower horizontal line shows the Lower Control Limit (LCL), which is zero in this example. The range chart is used to track the variation of the system and provides of the spread and inconsistency of the system performance parameter (such as the CNR).

Figure 4:
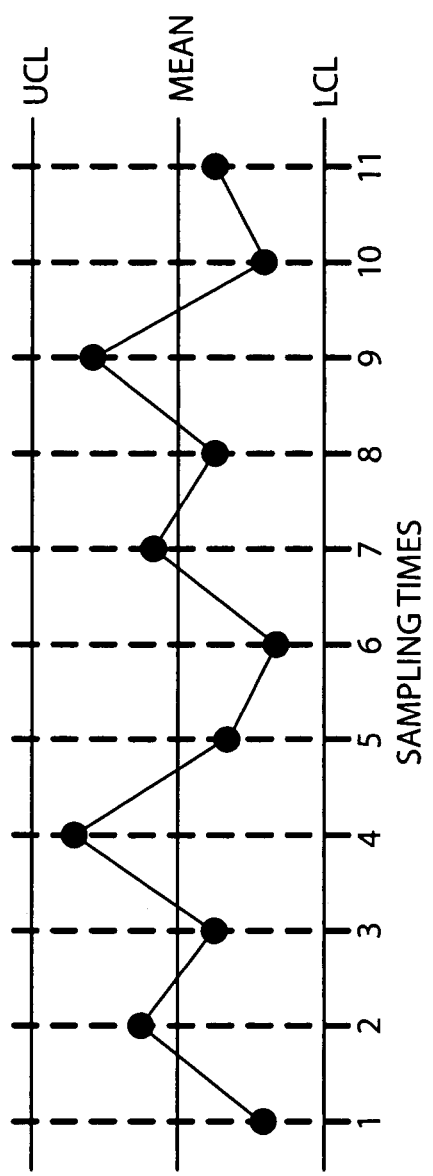
FIGS. 4-6 are exemplary Shewhart Mean Charts, consistent with an embodiment of the present invention.

An exemplary Shewhart Mean Chart is shown in FIG. 4. The upper horizontal line shows the Upper Control Limit (UCL), which may be set to the mean level plus three times the standard deviation. The lower horizontal line shows the Lower Control Limit (LCL), which may be set to the mean level minus three times the standard deviation. The mean chart provides an indication of the centering of the system performance parameter.

Figure 5:
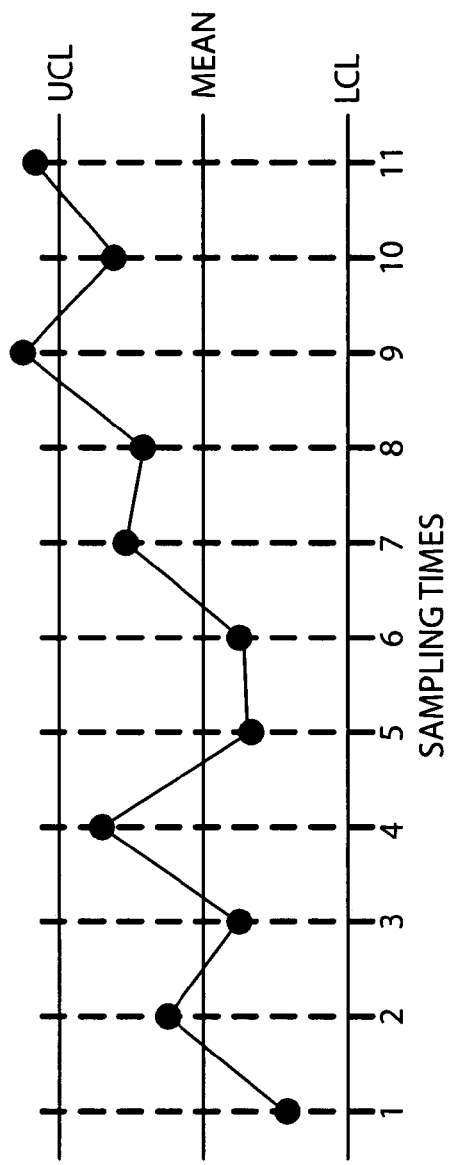

The charts in FIG. 3 and FIG. 4 show system performance parameters that are in control, since the sample values are within the upper and lower control limits. The Shewhart Mean Chart shown in FIG. 5 shows a system that is out of control. In FIG. 5, the sample values at sampling times 9 and 11 exceed the upper control limit (UCL). It is highly unlikely that such values are the result of normal system fluctuations and so the chart indicates that the system gain should be adjusted.

Figure 6:
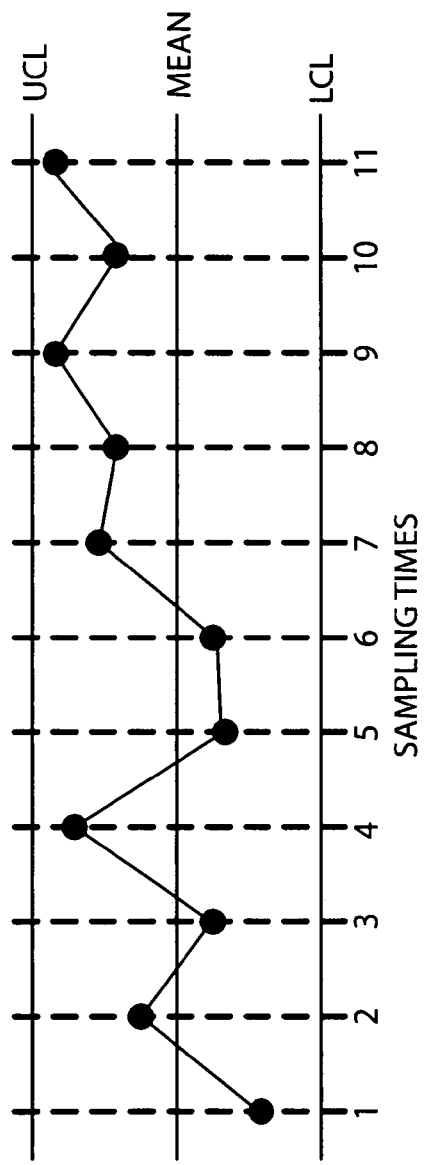

The Shewhart Mean Chart shown in FIG. 6 shows a system that, while not out of control, may be out of adjustment. In FIG. 6, the sample values at sampling times 7-11 show an increasing trend or run and are consistently above the center horizontal line (which denotes the long term mean of the mean value, also called the central value). The system performance parameter is no longer centered.

The AGC controller uses $\overline{X}$ (mean) and R (range) charts to control the variable gain amplifiers. In operation, if the mean chart shows the system performance parameter is no longer centered or exceeds the natural tolerances of the system, an analysis is performed to determine whether to adjust the gains or to adjust the limits of the chart. If the range chart shows a significant change in the variation (increase or decrease) of the system performance parameter, it is an indication that an adjustment may be needed and an analysis is perform to determined whether to loosen or tighten the control limits on the mean chart, so as to better match the inherent capability of the system itself or to meet the external needs of the system.

In one embodiment of the automatic gain controller, a positive error, i.e. an excess CNR, causes an increase in gain in an amount related to the absolute value of error, while a negative error decreases the gain in an amount related with the absolute value of error.

The description above explains how Statistical Process Control and control charts can be used to determine if a gain adjustment is required. Below we describe an exemplary method quantifying the amount of gain adjustment to be made.

It is noted that both the system performance parameter and the controlling signal (RF AGC and base band AGC) are approximately piece-wise linear over their applicable limits. In one embodiment of the invention, the functionality of the combination of test parameter and gains can be defined as piece-wise and may be stored in a look-up table. However, the table may require a very fine granularity. An alternative embodiment utilizes fuzzy logic control that allows the piece-wise linear elements (CNR and AGCs) to be fused into an operational non-linear function.

Figure 7:
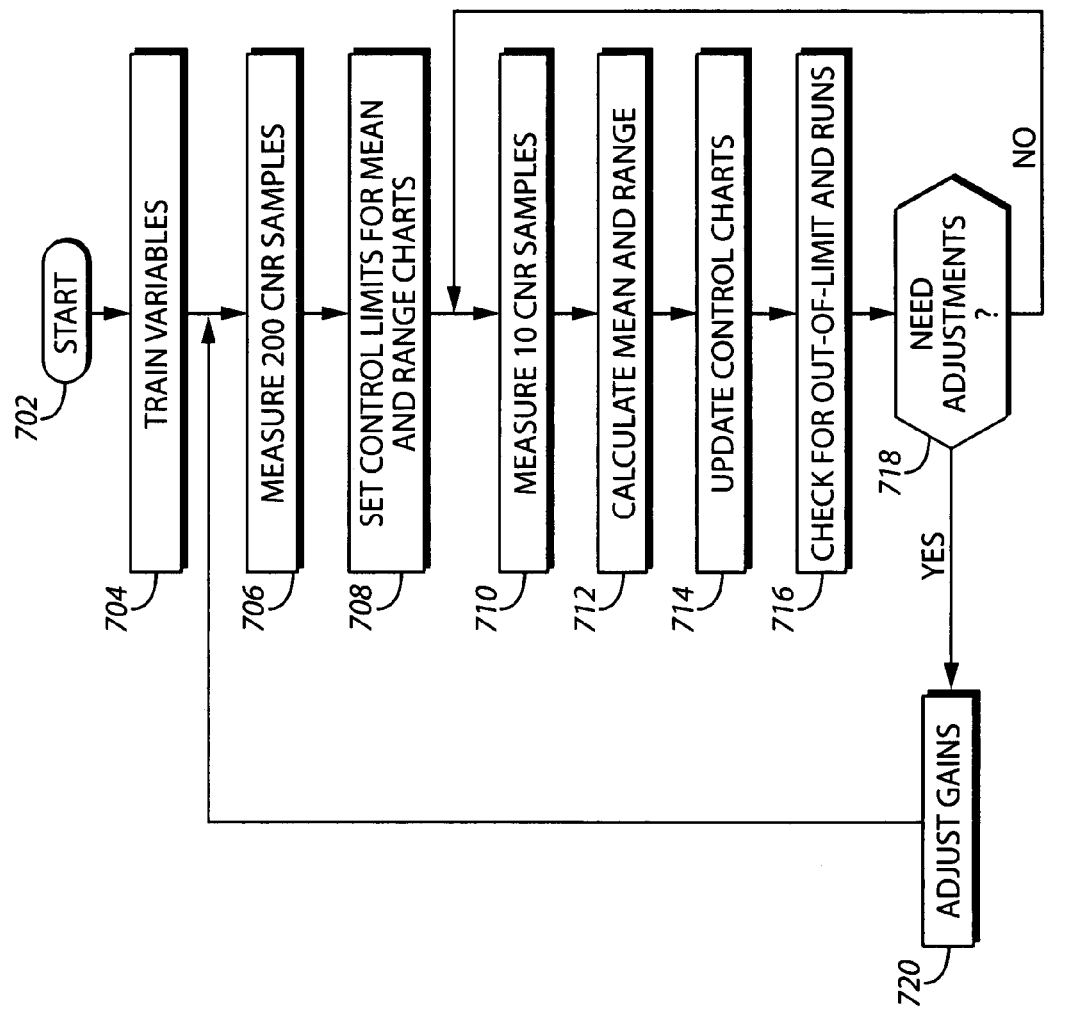
FIG. 7 is flow chart of a method consistent with an embodiment of the present invention.

A flow chart, consistent with certain embodiments of the invention, of a method of operation of an automatic gain controller using fuzzy logic is shown in FIG. 7. In this example, the CNR will be used as the system performance parameter, but other parameters may be used, as will be described below. Referring to FIG. 7, following start block 702, the variables for the fuzzy logic controller are trained at block 704. This training determines maximum and minimum values for gain adjustments, for granularity and for linearity of gain adjustments. At block 706, 200 or more CNR samples are measured. To measure each CNR sample at least 100 datum points are collected, as will be described below. At block 708 the upper control limit of the range chart is set and the control limits of the mean chart are set. This may be done by measuring the mean and standard deviation of the CNR over the 200 or more samples and setting the control limits as the mean plus and minus a number of standard deviations. At block 710, 10 CNR samples are measured (again, using at least 100 datum points for each sample). At block 712, the statistical values (in this case the mean and range) of the 10 CNR samples are calculated and at block 714 the control charts are updated with the new sampling point. At block 716 the statistical values are checked against the control limits and a check is made to determine if there are any "runs" in the charts, that is, if the chart is no longer centered. If gain adjustment is needed, as indicated by the positive branch from decision block 718, the variable gains are adjusted at block 720. Flow then returns to block 706, to allow the control limits of the chart to be reset. If the statistics are within the control limits and no runs are detected, as indicated by the negative branch from decision block 718, flow then returns to block 710, so that further chart values can be measured.

It will apparent to those of ordinary skill in the art that various numbers of CNR sample sets may be measured at each step and that various numbers of datum points may be averaged in each CNR sample.

Measurement of the system performance parameter will now be described for an exemplary embodiment, in which the communication signal is a band-pass modulated signal, using quadrature phase shift keying (QPSK). This is the case in satellite broadcasting, for example. The recovered digital communication signal, i.e. the demodulated base-band signal, has in-phase (I) and quadrature (Q) components. In one embodiment of the invention, the performance of the system is estimated by monitoring the in-phase and quadrature components of the demodulated base-band signal.

Figure 8:
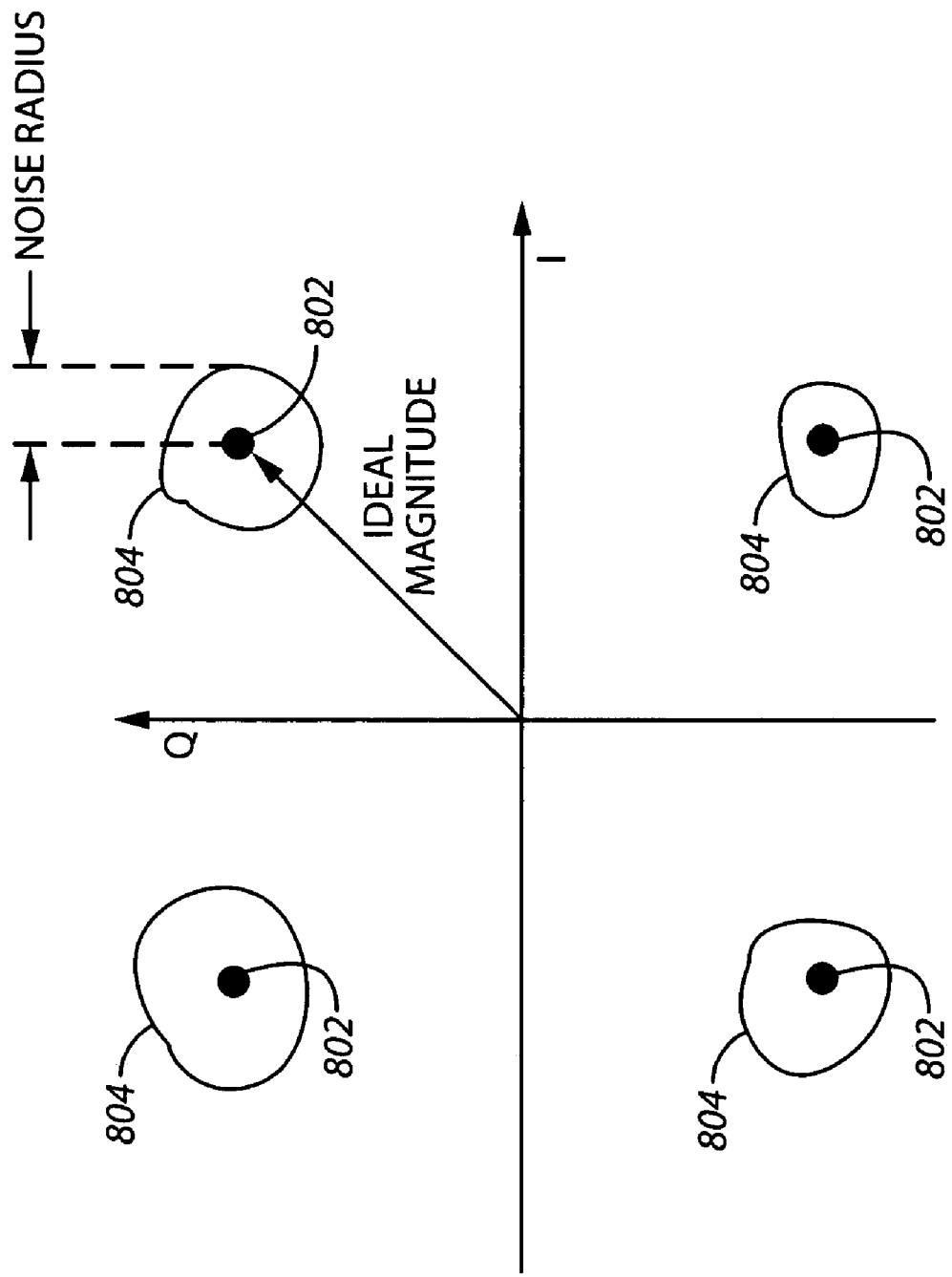
FIG. 8 is a graph of ideal and measured signal components.

FIG. 8 is a graph plotting I and Q components of the received base-band signal. The in-phase (I) component is plotted on the x-axis and quadrature (Q) component on the y-axis. The ideal positions, called constellation states, are shown as circles 802, although each circle denotes a single point. The actual received states can be within the areas 804.

The areas 804 show the deviation of the real positions of the signal from the ideal positions of the signal. The size of the areas 804 increases with added noise and decreases with lower noise. In one embodiment of the invention, the size of these areas is used to estimate the performance of the system—small areas correspond to good performance, large areas correspond to poor performance.

An error vector magnitude (EVM) may be calculated as $$EVM = \frac{\sqrt{\frac{1}{N}\sum_{n=1}^{N}([I_{IDEAL} - I_{MEASURED}(n)]^2 + [Q_{IDEAL} - Q_{MEASURED}(n)]^2)}}{\sqrt{I_{IDEAL}^2 + Q_{IDEAL}^2}},$$

where N is the number of total samples used to determine the average, $I_{MEASURED}(n)$ is the I component of sample n, and $Q_{MEASURED}(n)$ is the Q component of sample n. The components $|I_{IDEAL}|$ and $|Q_{IDEAL}|$ of the ideal positions, if not known in advance, may be estimated by long term averaging. Referring to FIG. 8, the error vector magnitude can be written as $$EVM = \frac{\text{NOISE RADIUS}}{\text{IDEAL MAGNITUDE}}.$$

The carrier-to-noise ratio (in decibels) is given by $$CNR_{dB} = -20\text{Log}(EVM).$$

Either the carrier-to-noise ratio (CNR) or the EVM can be used as the system performance indicator. High CNR indicates good performance, while low EVM indicates good performance. The automatic gain controller monitors statistical values of the system performance parameter, such as the mean of the CNR and the range of the CNR. These are obtained from a number of consecutive measurements of the CNR (which is itself an averaged value). Other system performance indicators related to BER can be used.

Alternatively, the CNR can be calculated from the mean deviation defined as $$MeanDeviation = \frac{\frac{1}{N}\sum_{n=1}^{N}(|I_{IDEAL} - I_{MEASURED}(n)| + |Q_{IDEAL} - Q_{MEASURED}(n)|)}{|I_{IDEAL}| + |Q_{IDEAL}|}.$$

The mean value may be calculated over M successive samples as $$\overline{X} = \frac{1}{M}\sum_{m=1}^{M} CNR_{dB}(m),$$

and the range may be calculated as $$R = \max_{m=1,\ldots,M}\{CNR_{dB}(m)\} - \min_{m=1,\ldots,M}\{CNR_{dB}(m)\}.$$

Those of ordinary skill in the art will recognize that the present invention has been described in terms of exemplary embodiments. However, the invention should not be so limited, since the present invention could be implemented using hardware component equivalents such as special purpose hardware and/or dedicated processors, which are equivalents to the invention as, described and claimed. It will be further understood by those skilled in the art that various changes in form and detail may be made therein without departing from the spirit and scope of the invention.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method for automatic control of a variable gain in a communication system, comprising:
    measuring a plurality of values of a system performance parameter indicative of the performance of the communication system;
    determining a statistical value of the plurality of values of the system performance parameter;
    adjusting the variable gain if the statistical value is outside of a control limit, and
    adjusting the variable gain if the statistical value consistently deviates from a central value.

2. A method in accordance with claim 1, wherein the system performance parameter is an error vector magnitude (EVM) of the communication system.

3. A method in accordance with claim 1, wherein the system performance parameter is a carrier-to-noise ratio (CNR) of the communication system.

4. A method in accordance with claim 3, wherein the communication system comprises a base-band demodulator, and wherein the carrier-to-noise ratio is measured after the base-band demodulator.

5. A method in accordance with claim 1, wherein the statistical value is at least one of the mean of the bit error rate and the range of the bit error rate.

6. A method in accordance with claim 1, wherein the statistical value is at least one of the mean of the carrier-to-noise ratio and the range of the carrier-to-noise ratio.

7. A method in accordance with claim 1, wherein adjusting the variable gain comprises:
    increasing the variable gain if the statistical value indicates that the performance of the communication system is low; and
    decreasing the variable gain if the statistical value indicates that the performance of the communication system is high.

8. A method in accordance with claim 1, further comprising:
    determining a plurality of statistical values; and
    setting the control limit in accordance with the plurality of statistical values.

9. A method in accordance with claim 8, wherein the control limit is approximately equal to the mean of the statistical value plus three standard deviations of the statistical value.

10. A method in accordance with claim 8, wherein the control limit is approximately equal to the mean of the statistical value minus three standard deviations of the statistical value.

11. A method in accordance with claim 1, wherein adjusting the variable gain if the statistical value is outside of a control limit uses a look-up table of gains indexed by the statistical value.

12. A method in accordance with claim 1, wherein adjusting the variable gain if the statistical value is outside of a control limit uses fuzzy logic control.

13. A method in accordance with claim 12, further comprising training variables of the fuzzy logic control.

14. A method in accordance with claim 1, wherein the central value is a prior mean of the statistical value.

15. A method in accordance with claim 1, wherein measuring a value of the system performance parameter comprises measuring a deviation of a plurality of received in-phase and quadrature components from ideal in-phase and quadrature components.

16. A method for automatic control of a variable gain in a communication system. comprising:
 measuring a plurality of values of a system performance parameter indicative of the performance of the communication system;
 determining a statistical value of the plurality of values of the system performance parameter: and
 adjusting the variable gain if the statistical value is outside of a control limit. wherein the system performance parameter is a parameter selected from a group consisting of a bit error rate (BER) of the communication system, an error vector magnitude (EVM) of the communication system, and a carrier-to-noise ratio (CNR) of the communication system.

17. A method in accordance with claim 16, wherein the communication system comprises a base-band demodulator, an inner forward error corrector and an outer forward error corrector, and wherein the bit error rate is measured after the inner forward error corrector.

18. A method for automatic control of a variable gain in a communication system, comprising:
 measuring a plurality of values of a system performance parameter indicative of the performance of the communication system:
 determining a statistical value of the plurality of values of the system performance parameter;
 adjusting the variable gain if the statistical value is outside of a control limit, and
 if the statistical value is outside of a control limit:
  determining a plurality of statistical values; and
  setting the control limit in accordance with the plurality of statistical values.

19. A communication receiver comprising:
 a first amplifier having a variable gain and operable to amplify a signal in the communication receiver; and
 an automatic gain controller, operable to monitor the performance of the communication receiver and calculate a statistical value indicative of the performance of the communication system, and further operable to adjust the variable gain of the first amplifier if the statistical value consistently deviates from a central value.

20. A communication receiver in accordance with claim 19, wherein monitoring the performance of the communication receiver comprises monitoring the bit error rate.

21. A communication receiver in accordance with claim 19, further comprising:
 an analog stage operable to receive a radio frequency signal and produce a base-band signal therefrom;
 an analog to digital converter operable to sample the base-band signal to produce a sampled base-band signal; and
 a digital stage operable to receive the base-band signal and produce a decode information symbol therefrom.

22. A communication receiver in accordance with claim 21, wherein the first amplifier is operable to amplify a signal in the analog stage of the communication receiver.

23. A communication receiver in accordance with claim 21, wherein the first amplifier is operable to amplify a signal in the digital stage of the communication receiver.

24. A communication receiver in accordance with claim 21, further comprising a second amplifier having a variable gain, wherein the first amplifier is operable to amplify a signal in the analog stage and the second amplifier is operable to amplify a signal in the digital stage and wherein the automatic gain controller is operable to adjust the variable gain of the first amplifier and the variable gain of the second amplifier in response to the statistical value to maintain the statistical value in a control range.

25. A communication receiver in accordance with claim 21, wherein the digital stage comprises a decoder and wherein the statistical value is dependent upon a carrier-to-noise ratio estimated in the decoder.

26. A communication receiver in accordance with claim 21, wherein the digital stage comprises a decoder having an inner forward error corrector and an outer forward error corrector, and wherein the statistical value is dependent upon a carrier-to-noise ratio estimated from the input to the inner forward error corrector.

27. A communication receiver in accordance with claim 21, wherein the digital stage comprises a decoder having an inner forward error corrector and an outer forward error corrector, and wherein the statistical value is dependent upon a carrier-to-noise ratio estimated from the output of the inner forward error corrector.

28. A communication receiver in accordance with claim 19, wherein the automatic gain controller is further operable to monitor the performance of the communication receiver, calculate a plurality of statistical values indicative of the performance of the communication system, and adjust the control range in response to the plurality of statistical values.

29. A communication receiver comprising:
 an amplifier means for amplifying a signal in the communication receiver; and
 an automatic gain control means, for monitoring the performance of the communication receiver, calculating a statistical value indicative of the performance of the communication system, and adjusting the variable gain of the amplifier means to maintain the statistical value in a control range if the statistical value consistently deviates from a central value.

30. A communication receiver in accordance with claim 29, further comprising:
 an analog stage for receiving a radio frequency signal and producing a base-band signal therefrom;
 a sampling means for sampling the base-band signal and producing a sampled base-band signal; and
 a digital stage for receiving the base-band signal and producing a decoded information symbol therefrom.

31. A communication receiver in accordance with claim 30, wherein the amplifier means is operable to amplify a signal in the analog stage of the communication receiver.

32. A communication receiver in accordance with claim 30, wherein the amplifier means is operable to amplify a signal in the digital stage of the communication receiver.

* * * * *